(12) United States Patent
Speyer et al.

(10) Patent No.: US 7,326,582 B2
(45) Date of Patent: Feb. 5, 2008

(54) OPTICAL ISOLATOR DEVICE, AND METHOD OF MAKING SAME

(75) Inventors: Chris Speyer, Austin, TX (US); William E. Moore, Round Rock, TX (US)

(73) Assignee: Legerity, Inc., Austin, TX (US)

( * ) Notice: Subject to any disclaimer, the term of this patent is extended or adjusted under 35 U.S.C. 154(b) by 0 days.

(21) Appl. No.: 11/621,863

(22) Filed: Jan. 10, 2007

(65) Prior Publication Data

US 2007/0111464 A1    May 17, 2007

Related U.S. Application Data

(62) Division of application No. 10/817,982, filed on Apr. 5, 2004, now Pat. No. 7,180,098.

(51) Int. Cl.
*H01L 21/00* (2006.01)
(52) U.S. Cl. .............. 438/22; 438/24; 257/82
(58) Field of Classification Search ............ 438/22, 438/24; 257/82
See application file for complete search history.

(56) References Cited

U.S. PATENT DOCUMENTS 5,128,729 A * 7/1992 Alonas et al. ............ 257/433
5,438,210 A * 8/1995 Worley ..................... 257/82
5,789,960 A * 8/1998 Bower ..................... 327/333
6,407,402 B1 * 6/2002 Ghaseminejad .......... 250/551

* cited by examiner

*Primary Examiner*—Douglas M. Menz
(74) *Attorney, Agent, or Firm*—Williams, Morgan & Amerson, P.C.

(57) ABSTRACT

The present invention is generally directed to an optical isolator device, and various methods of making same. In one illustrative embodiment, the method comprises obtaining a single SOI substrate, the SOI substrate having an active layer comprised of silicon and a buried insulation layer, forming a doped layer of silicon above the active layer of the SOI substrate, forming first and second isolated regions in at least the doped layer of silicon, forming a photon generating device in the first isolated region, and forming a photon receiving device in the second isolated region. In one illustrative embodiment, the device comprises a substrate comprised of a bulk layer of silicon, a buried insulation layer formed on the bulk silicon layer, and a doped layer of silicon positioned above the buried insulating layer, first and second isolated regions formed in the doped layer of silicon, a photon generating device formed in the first isolated region, and a photon receiving device formed in the second isolated region.

26 Claims, 6 Drawing Sheets

OPTICAL ISOLATOR DEVICE, AND METHOD OF MAKING SAME

CROSS-REFERENCE TO RELATED APPLICATIONS

This application is a divisional of prior U.S. patent application Ser. No. 10/817,982, filed Apr. 5, 2004 now U.S. Pat. No. 7,180,098, entitled "OPTICAL ISOLATOR DEVICE, AND METHOD OF MAKING SAME."

BACKGROUND OF THE INVENTION

1. Field of the Invention

This invention is generally related to the field of semiconductor devices, and, more particularly, to an optical isolator device, and various methods of making same.

2. Description of the Related Art

In many practical applications, it is desired to transmit signals between two electrical circuits that are electrically isolated from each other. Due to a desire for small size and complete electrical isolation between the circuits, four terminal devices, commonly called opto-isolators, have been developed. These devices utilize optical coupling, rather than the electrical coupling used in transformers and relays, to link the two electrical circuits. Opto-isolators use a light source, commonly a light emitting diode (LED), located in the electrical input circuit, and a photodetector or receiver, located in the electrical output circuit and optically coupled to the light source, to couple the two electrical circuits. Current flowing in the input circuit causes the LED to emit light, and some of this light is received by the photodetector and causes an electrical current to flow in the output circuit. It should be understood that the term "light," as used in the specification, refers to electromagnetic radiation in both the visible and infrared regions.

Opto-isolators typically use discrete devices. That is, the light source and photodetector are manufactured separately and individually positioned in an optical cavity to form the opto-isolator. The light source is connected to two input terminals, and the photodetector is connected to two output terminals. The light source and photodetector are generally formed from different materials. For example, opto-isolators commonly used today have LEDs made from direct semiconductors, such as GaAs, GaP, SiC, $GaAs_{1-x}P_x$ and $Ga_{1-x}Al_xAs$ photodetectors. The presence of discrete devices means that considerable care has to be exercised in positioning the LED and the photodetector, both with respect to each other and the cavity, to obtain efficient light coupling. Additionally, cavity construction and the material used to form the cavity are often critical.

For reasons of manufacturing economics, as well as efficient coupling of light between the light source and detector, a monolithic or integrated opto-isolator would be desirable. Such a device would be fabricated on a single semiconductor chip from a single semiconductor material, i.e., both the light source and light detector would consist of the same semiconductor material. The use of a single material and a single chip affords the possibility of simplicity of fabrication as positioning of the LED and photodetector with respect to each other may be accomplished automatically. The automatic positioning of the LED and photodetector with respect to each other may reduce optical losses due to misalignment of the LED and photodetector.

U.S. Pat. No. 4,275,404 discloses one illustrative example of a monolithic opto-isolator. As depicted therein, the opto-isolator is constructed with the light source and the light detector disposed on the substrate formed from an epitaxially grown Group II-VI or Group III-V semiconductor compound and admixtures thereof. According to the disclosure, U.S. Pat. No. 4,275,404 contemplates the use of a substrate having a resistivity of at least $10^4$ ohm-cm to obtain high isolation voltages.

Despite the existence of optical isolators in the prior art, there is still a desire for such opto-isolators that may be fabricated economically and reliably and constructed on a single chip or substrate. Such a construction would allow easy integration with other manufacturing processes, reduced costs, increased packing densities and reduce the overall size of a resulting product incorporating such a device.

The present invention is directed to a device and various methods that may solve, or at least reduce, some or all of the aforementioned problems.

SUMMARY OF THE INVENTION

The present invention is generally directed to an optical isolator device, and various methods of making same. In one illustrative embodiment, the method comprises obtaining a single SOI substrate, the SOI substrate having an active layer comprised of silicon and a buried insulation layer, forming a doped layer of silicon above the active layer of the SOI substrate, forming first and second isolated regions in at least the doped layer of silicon, forming a photon generating device in the first isolated region, and forming a photon receiving device in the second isolated region.

In another illustrative embodiment, the method comprises obtaining a single SOI substrate, the SOI substrate having an active layer comprised of silicon and a buried insulation layer, forming a doped layer of epitaxial silicon above the active layer of the SOI substrate, forming first and second isolated regions in at least the doped layer of epitaxial silicon, forming a photon generating device in the first isolated region, and forming a photon receiving device in the second isolated region.

In yet another illustrative embodiment, the method comprises obtaining a single SOI substrate, the SOI substrate having a doped active layer comprised of silicon formed on a buried insulation layer, forming first and second isolated regions in the doped active layer of silicon, forming a photon generating device in the first isolated region, and forming a photon receiving device in the second isolated region.

In one illustrative embodiment, the device comprises a substrate comprised of a bulk layer of silicon, a buried insulation layer formed on the bulk silicon layer, and a doped layer of silicon positioned above the buried insulating layer, first and second isolated regions formed in the doped layer of silicon, a photon generating device formed in the first isolated region, and a photon receiving device formed in the second isolated region.

In another illustrative embodiment, the device comprises a substrate comprised of a bulk layer of silicon, a buried insulation layer formed on the bulk silicon layer, and a doped layer of epitaxial silicon positioned above the buried insulating layer, first and second isolated regions formed in the doped layer of epitaxial silicon, a photon generating device formed in the first isolated region, and a photon receiving device formed in the second isolated region.

In yet another illustrative embodiment, the device comprises a substrate comprised of a bulk layer of silicon, a buried insulation layer formed on the bulk silicon layer, and a doped layer of silicon in contact with the buried insulating layer, first and second isolated regions formed in the doped layer of silicon, a photon generating device formed in the first isolated region, and a photon receiving device formed in the second isolated region.

BRIEF DESCRIPTION OF THE DRAWINGS

The invention may be understood by reference to the following description taken in conjunction with the accompanying drawings, in which like reference numerals identify like elements, and in which.

Figure 1:
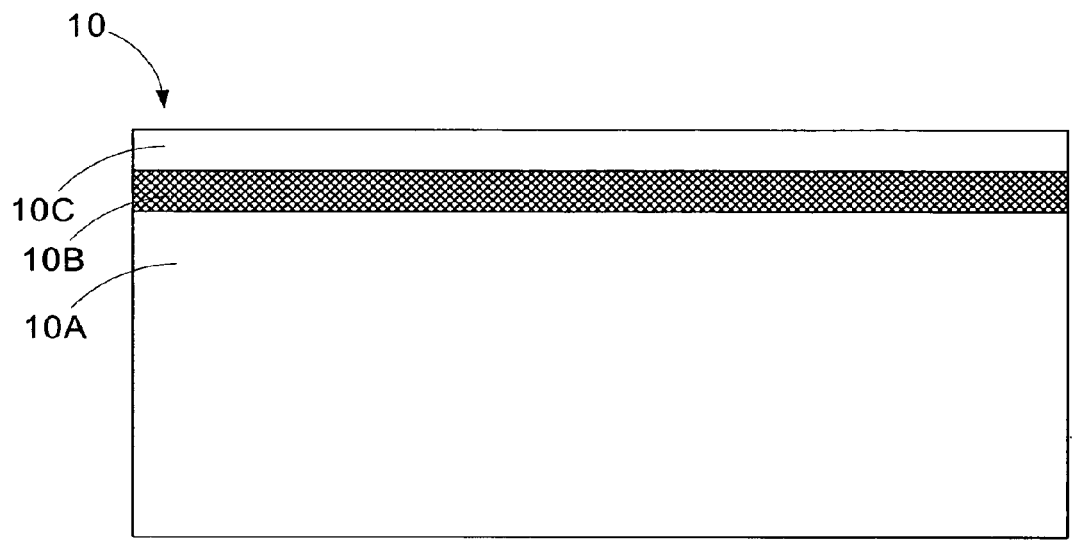
FIG. 1 depicts an illustrative silicon-on-insulator substrate that may be employed as a starting material for manufacturing a device in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various layers, doped regions and structures of the semiconductor devices are depicted in the drawings as having very precise, sharp configurations and profiles, those skilled in the art recognize that, in reality, these regions and structures may not be as precise as indicated in the drawings. Additionally, the relative sizes of the various features, regions and layers depicted in the drawings may be exaggerated or reduced as compared to the size of those features, regions or layers on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to an optical isolator device, and various methods of making and using same. As will be readily apparent to those skilled in the art upon a complete reading of the present application, the present invention may be used in connection with the formation of opto-isolators for use with a variety of different semiconductor devices, e.g., memory devices, logic devices, analog devices, etc. Moreover, the present invention may be employed with a variety of different technologies, e.g., CMOS, PMOS, NMOS devices, as well as bipolar devices. Thus, the present invention should not be considered as limited to any particular type of device or other methodologies employed in forming such a semiconductor device unless such limitations are expressly set forth in the appended claims.

In general, the present invention is directed to an optical isolation device comprised of a photon generating device, e.g., a diode, and a photon receiving device, e.g., a bipolar junction transistor, on a single silicon-based structure wherein the devices are positioned in separate isolated regions. For purposes of disclosure only, the present invention will be disclosed in the context where the photon generating device is a diode and the receiving device is a bipolar junction transistor. However, as will be recognized by those skilled in the art after a complete reading of the present application, the present invention has a broad applicability. Thus, the present invention should not be considered as limited to the precise methodologies and devices disclosed herein unless such limitations are expressly set forth in the appended claims.

FIGS. 1-7 will now be discussed in the context of disclosing one illustrative methodology for forming the optical isolation device of the present invention. Initially, an SOI substrate 10 is used as the starting material for the present invention. As depicted in FIG. 1, the SOI substrate 10 is comprised of a bulk substrate 10a, a buried insulation layer 10b and an active layer 10c. Typically the bulk silicon 10a is comprised of silicon, the buried insulation layer 10b is comprised of silicon dioxide (a so-called "BOX" layer), and the active layer 10c is comprised of silicon (doped or undoped). Such SOI structures may be readily obtained from a variety of commercially known sources. Typically, the buried insulation layer 10b will be relatively thick, e.g., on the order of approximately 1-2 microns, and the active layer 10c may have an initial thickness of approximately 2 microns.

Figure 2:
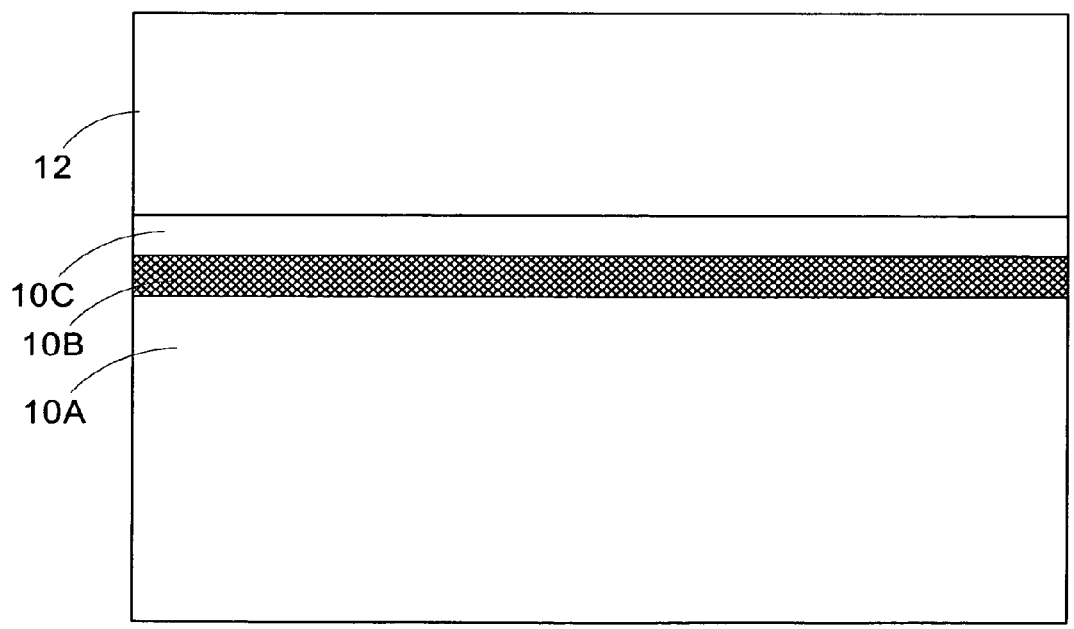
FIG. 2 depicts the device of FIG. 1 having an additional layer of silicon formed thereabove.

Thereafter, as indicated in FIG. 2, one method disclosed herein involves the formation of a doped layer of silicon 12 above the active layer 10c. In one embodiment, the layer of silicon 12 is doped with an N-type dopant material, e.g., phosphorous, arsenic, such that it has a resistivity of approximately 15 ohm-cm which corresponds to a dopant concentration of approximately $3\times10^{14}$ ions/cm$^3$. In one particular embodiment, the layer of silicon 12 is a layer of epitaxial silicon that is deposited in the epi reactor. In this situation, the layer of epitaxial silicon 12 may be doped by introducing dopant materials into an epi reactor during the process used to form the layer 12. However, the dopant material may also be introduced into the layer of silicon 12 by performing an ion implant process after the layer of silicon 12 is formed. Note that the distribution of dopant atoms within the layer of silicon 12 may not be uniform throughout its depth.

For purposes of explanation only, the drawings depict an interface between the active layer 10c and the layer of silicon 12. In practice, the distinction between these two layers may be very difficult to define. Nevertheless, the distinct layers are shown for purposes of explanation only. The layer of silicon 12 is relatively thick. In one illustrative embodiment, the layer of silicon 12 has a thickness that ranges from approximately 10-30 microns, depending on the particular application. Thereafter, although not depicted in the drawing, a field oxide layer may be formed above the layer of silicon 12 by performing, for example, a thermal growth process. During this process, the area where the optical isolator device will be formed is masked so as to prevent formation of the field oxide layer in that area.

Figure 3:
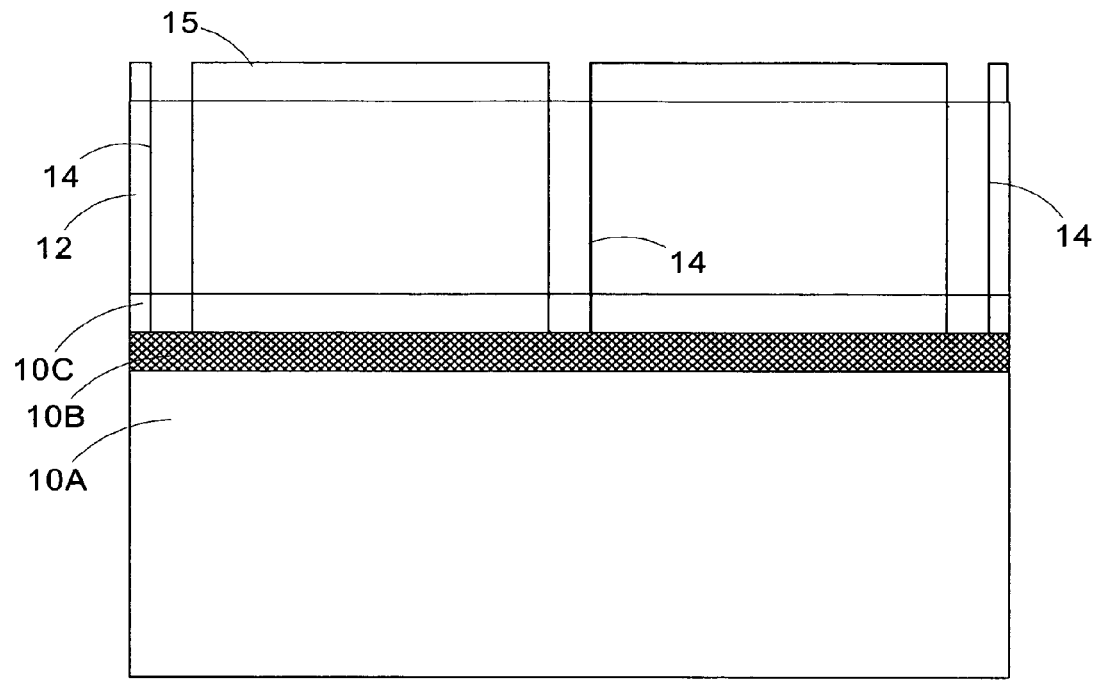
FIG. 3 depicts the device of FIG. 2 after a plurality of trenches have been formed on the device.
Figure 4:
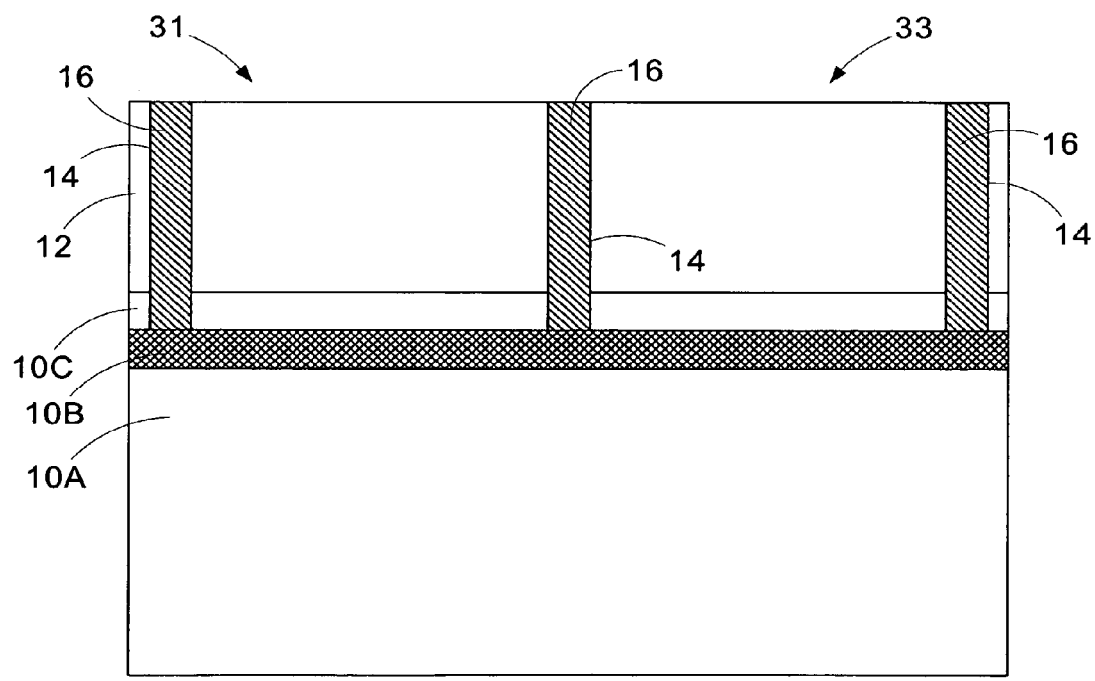
FIG. 4 depicts the device of FIG. 3 after at least one insulating material has been positioned in the previously formed trenches.

Next, first and second isolated regions 31, 33, respectively, are created (see FIG. 4). The isolated regions 31, 33 may be created using a variety of techniques. In one illustrative embodiment, as indicated in FIG. 3, a plurality of trenches 14 are etched through the layer of silicon 12, the active layer 10c, and terminate on the buried insulation layer 10b. The trenches 14 are formed by performing known photolithography and etching processes. For example, an illustrative patterned masking layer 15, e.g., photoresist, is formed above the layer of silicon 12 and thereafter one or more anisotropic etching processes are performed to form the trenches 14. The width of the trenches 14 may vary. In one illustrative example, the trenches 14 have a width of approximately 2 microns. Then, as indicated in FIG. 4, the trenches 14 may be filled with one or more insulating materials. For example, the trenches 14 may be filled with silicon dioxide, with a combination of silicon dioxide, silicon nitride and polysilicon, etc. In general, the type and nature of the insulating material positioned in the trenches 14 should not be considered a limitation of the present invention. That is, any form or type of materials or combinations thereof sufficient to perform the insulating functions described herein may be positioned in the trenches 14.

Figure 5:
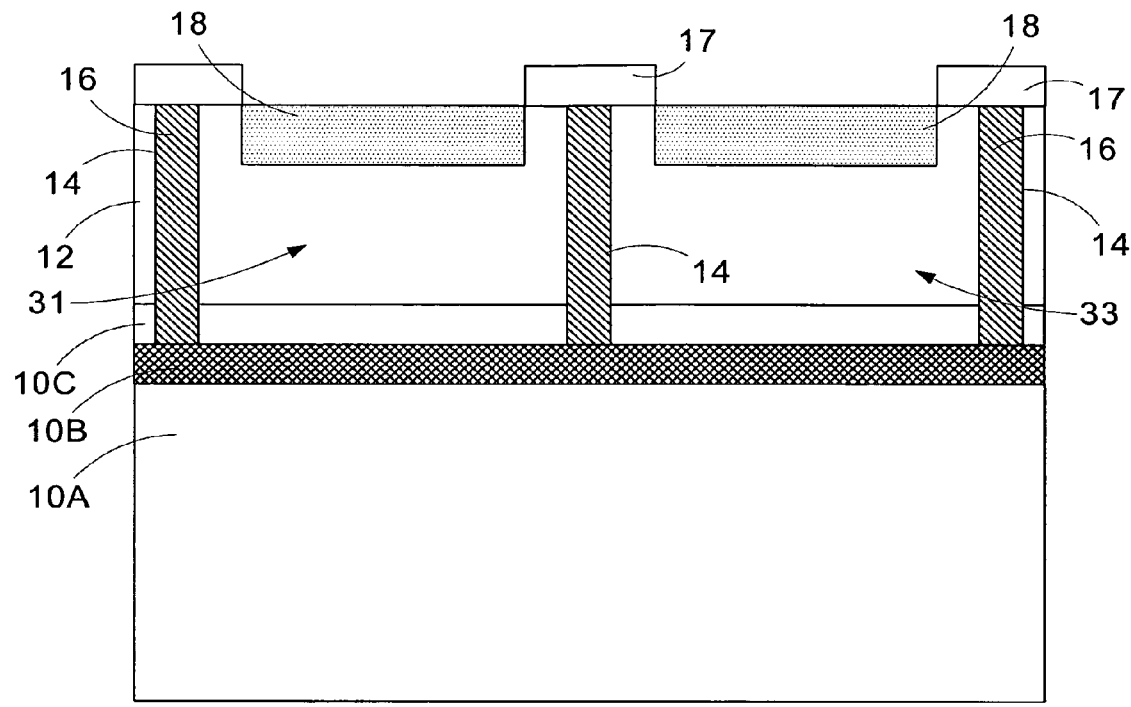
FIG. 5 depicts the device of FIG. 4 after a plurality of base regions have been formed in the device.
Figure 6:
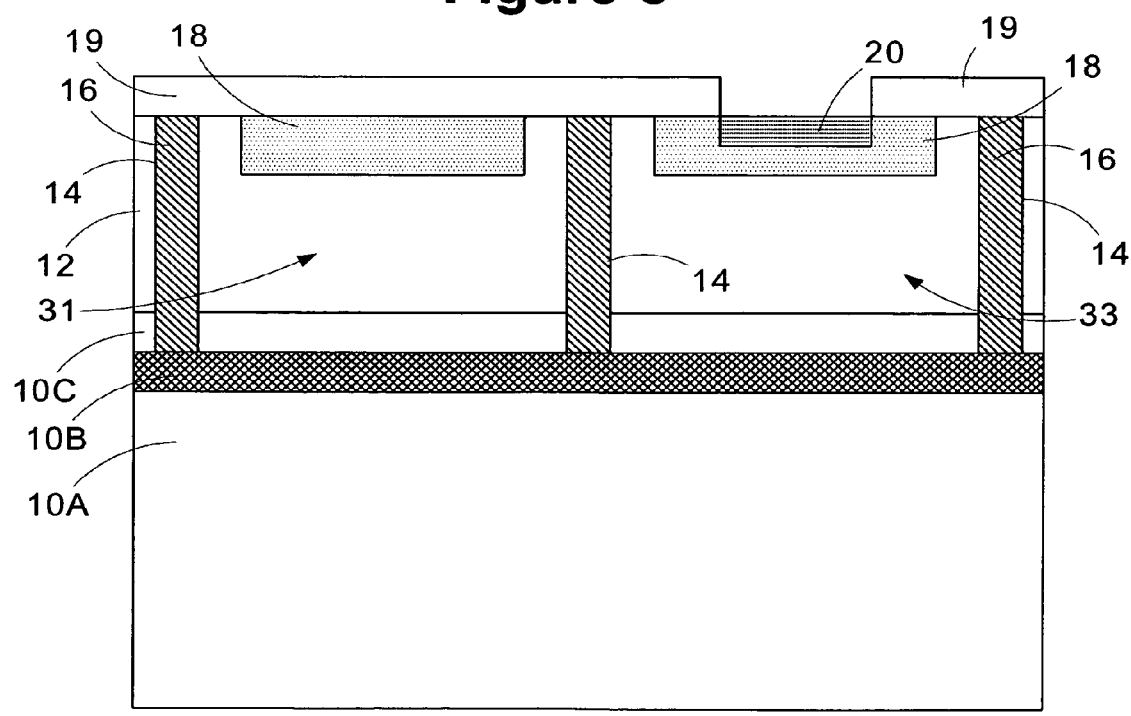
FIG. 6 depicts the device of FIG. 5 after an emitter region has been formed in a portion of the device.
Figure 7:
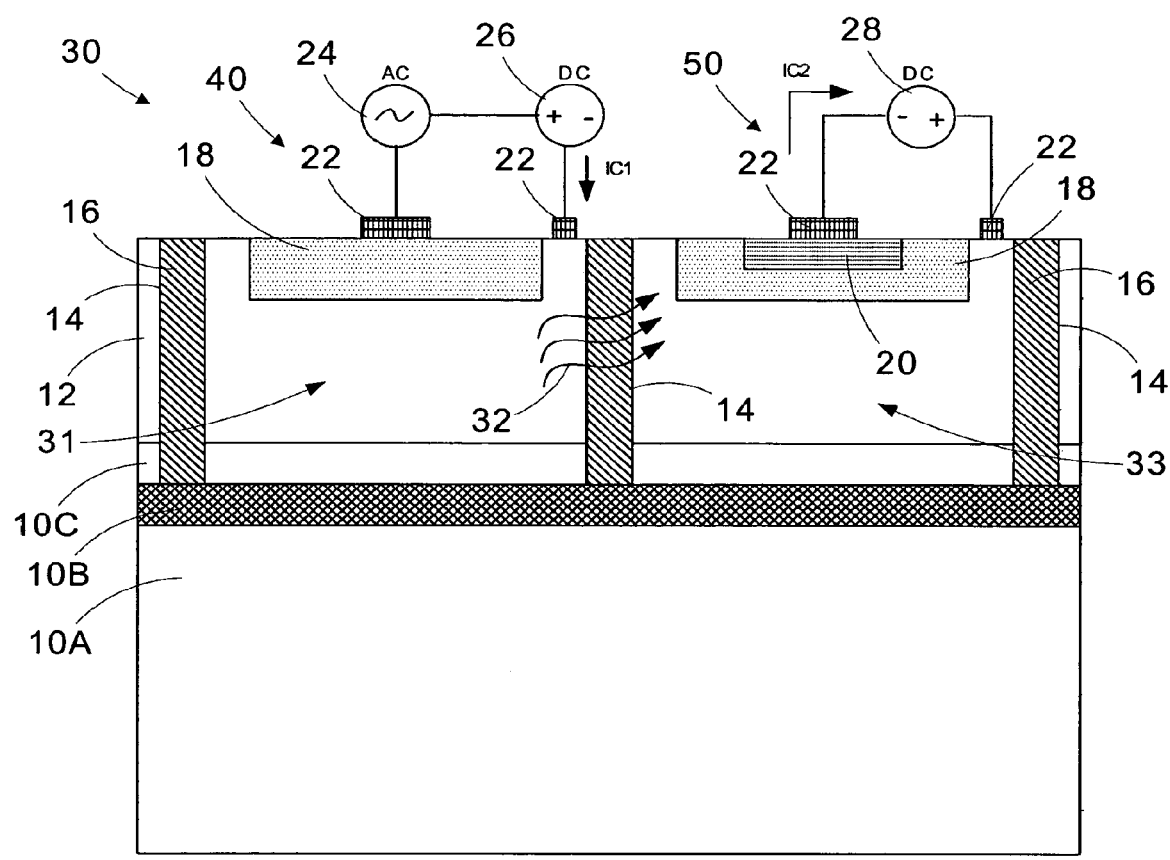
FIG. 7 depicts one illustrative embodiment of an opto-isolator device in accordance with the present invention.

Ultimately, a photon generating device will be formed in one of the isolated regions 31, 33 and a photon receiving device will be formed in the other of the isolated regions 31, 33. To that end, FIGS. 5-7 depict illustrative process steps for forming illustrative examples of the photon generating device and the photon receiving device. However, as indicated earlier, the present invention should not be considered as limited to the illustrative photon receiving device and photon generating device or the particular process steps described to make such devices unless such limitations are expressly recited in the appended claims.

In one illustrative example, the photon generating device and photon receiving device may be formed by performing at least the following steps. As indicated in FIG. 5, doped regions 18 are formed in the silicon layer 12. In the illustrative embodiment depicted herein, the doped regions 18 are doped with a P-type dopant material using an ion implant process performed through a patterned masking layer 17, such as a layer of photoresist material, formed above the layer of silicon 12. Of course, masking materials other than photoresist material may be employed with the present invention, e.g., various hard mask materials. The doped regions 18 may be formed by performing an ion implant process using P-type dopant materials, e.g., boron, boron difluoride, at a dopant dose of approximately $1\times10^{14}$-$5\times10^{14}$ ions/cm$^2$, and at an energy level of approximately 50-150 keV. The resulting doped regions 18 may have a dopant concentration of approximately $10^{17}$-$10^{18}$ ions/cm$^3$ and a depth of approximately 3.5 microns. After the doped regions 18 are formed, the masking layer 17 may be removed by performing a variety of known processes. In general, the spacing between the doped regions 18 and the trench isolation regions 16 should be as close as practicable, e.g., approximately 20 microns or less.

Then, as indicated in FIG. 6, an emitter region 20 is formed within one of the previously formed doped regions 18. In one illustrative embodiment, the emitter region 20 is formed by performing an ion implant process performed through a patterned masking layer 19, such as a layer of photoresist material, formed above the layer of silicon 12. Of course, masking materials other than photoresist material may be employed with the present invention, e.g., various hard mask materials. The emitter region 20 may be formed by performing an ion implant process using N-type dopant materials, e.g., arsenic, phosphorous, at a dopant dose of approximately $5\times10^{15}$-$10^{16}$ ions/cm$^2$, and at an energy level of approximately 50-150 keV. The resulting emitter region 20 may have a dopant concentration of approximately $5\times10^{18}$-$10^{19}$ ions/cm$^3$ and a depth of approximately 1-3 microns. After the emitter region 20 is formed, the masking layer 19 may be removed by performing a variety of known processes.

Next, as indicated in FIG. 7, a plurality of schematically depicted contacts 22 are formed above various regions of the device using known contact formation methodologies. As a result, the opto-isolator device 30 of the present invention is comprised of a photon generating device 40 formed in the first isolated region 31 and a photon receiving device 50 formed in the second isolated region 33. In the depicted embodiment, the photon generating device 40 is a diode, and the receiving device 50 is a bipolar junction transistor. However, the photon generating device 50 may be other types of semiconductor devices, such as, for example, a forward or reverse biased diode, a bipolar transistor in saturation, field effect transistors, etc. Similarly, the photon receiving device 50 may be a forward or reverse biased diode, an avalanche diode, an avalanche transistor, a bipolar transistor, a field effect transistor, a PIN diode, etc. AC voltage source 24 and DC voltage source 26 are coupled to the photon generating device 40 as indicated in the drawing. The DC voltage source 26 is coupled to the receiving device 50, as indicated in FIG. 7. Moreover, although one illustrative embodiment of the device disclosed herein is comprised of a P$^+$/N$^-$ photon generating diode and an NPN receiving transistor, the invention may also be employed using an N$^+$/P$^-$ diode and a PNP receiving transistor depending on the particular application. Simply put, the transmitting device described herein may be either an N$^+$/P$^-$ or a P$^+$/N$^-$ device and the receiving device may be either an NPN or a PNP device. The invention disclosed herein may encompass all such combinations of devices depending upon the particular application.

In operation, the photon generating device 40, i.e., a diode, is forward biased such that photons 32 are generated. A constant potential is maintained across the emitter 20 and the collector of the illustrative bipolar transistor that functions as the photon receiving device 50. The current through the diode modulates the current through the bipolar transistor, i.e., the greater the current through the diode, the greater the current through the bipolar transistor. Conversely, the lesser the current through the diode, the lesser the current through the bipolar transistor.

Figure 8:
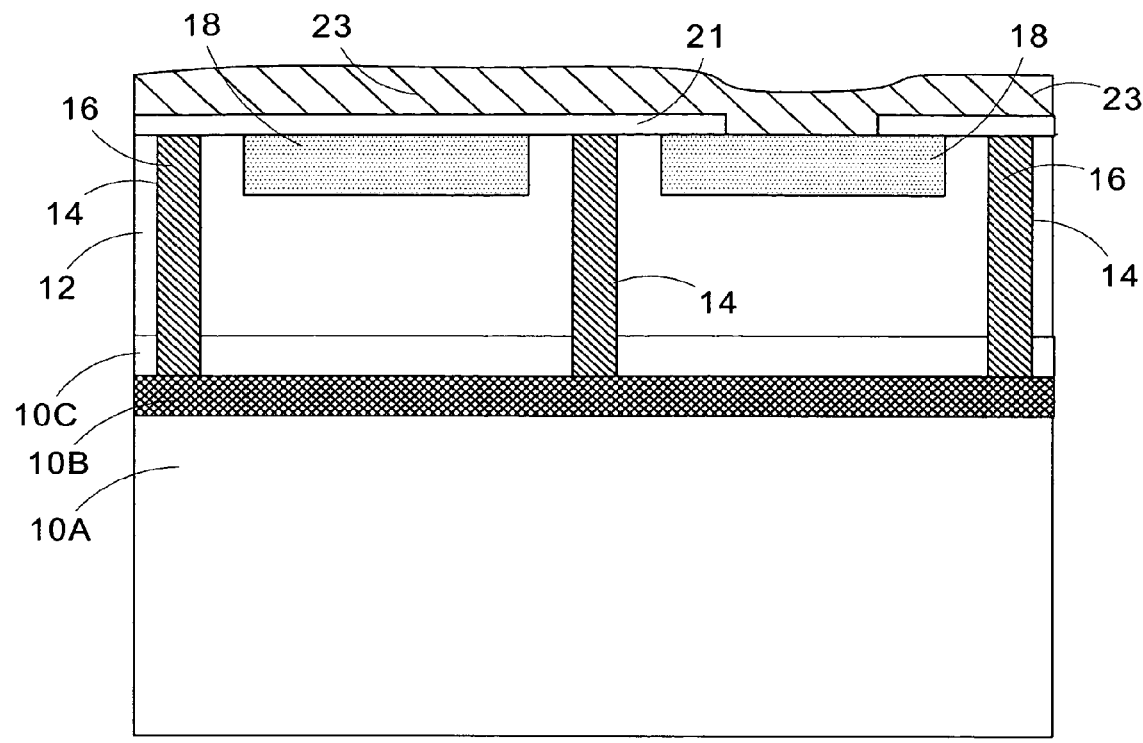
FIGS. 8-9 depict an alternative process flow for forming the emitter region on the device.
Figure 9:
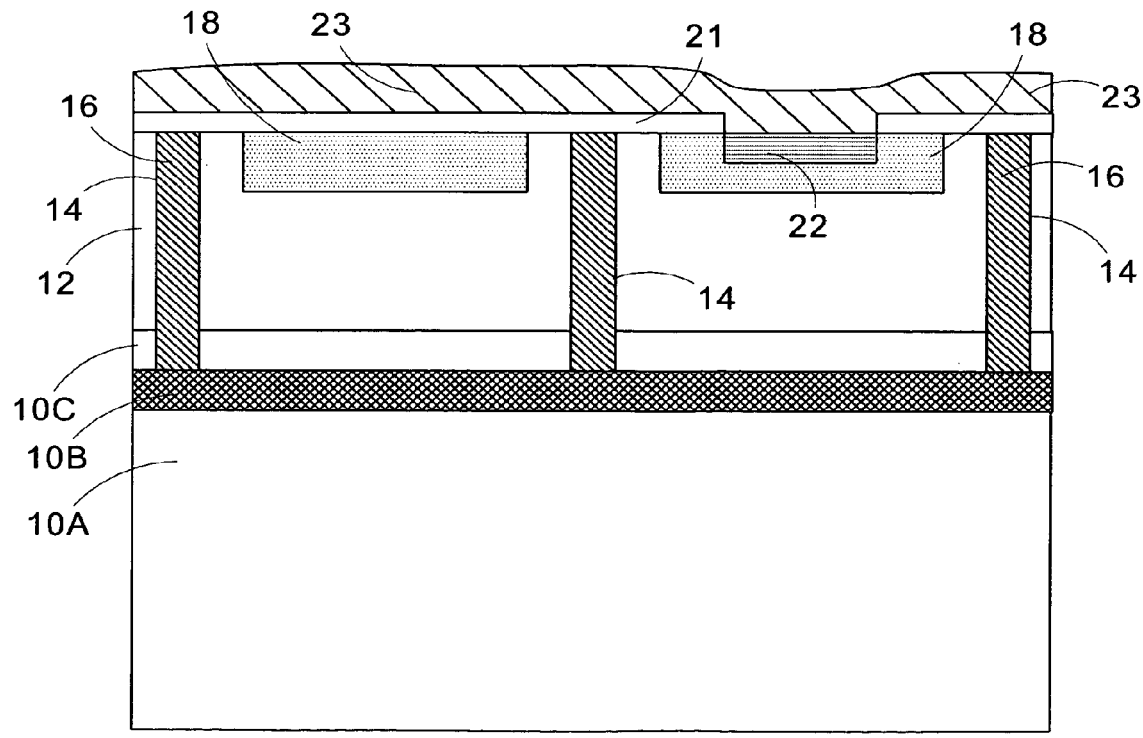

FIGS. 8-9 depict an alternative methodology for forming the emitter region 22 of the present invention. FIG. 8 depicts the device at the point of manufacture wherein the doped regions 18 have been formed as described above. Thereafter, an insulating material, such as silicon dioxide, may be formed above the layer of silicon 12. Note that the layer 21 may not be in contact with the layer of silicon 12 as there may be one or more intervening layers between the layer 21 and the layer of silicon 12. Next, a window 29 is formed in the layer 21 using a variety of known photolithography and etching processes. Thereafter, a doped layer of polysilicon 23 is formed above the layer 21 and contacts the layer of silicon 12. Then, by performing one or more heat treatment processes, dopant material from the doped layer of polysilicon 23 diffuses into the layer of silicon 12 to form the emitter region 22, as depicted in FIG. 9. The methodology depicted in FIGS. 8-9 depicts an alternative to forming the emitter region 22 by performing an ion implant process as indicated in FIG. 6.

Figure 10:
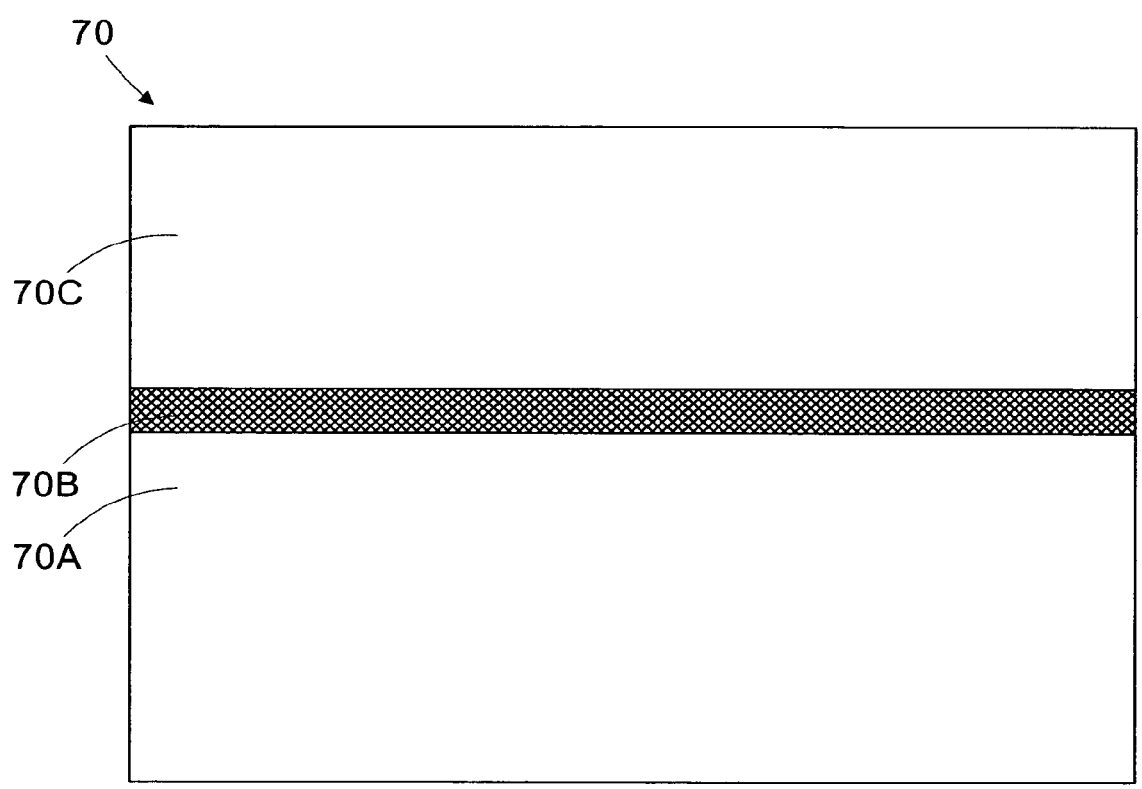
FIG. 10 depicts an alternative method of manufacturing the device of the present invention.

In the embodiments described thus far, the layer of silicon 12 is formed above the active layer 10c of the SOI substrate 10. In one particular embodiment, the layer of silicon 12 is a layer of epitaxial silicon that is formed in an epi reactor. However, in other embodiments, the starting material is a substrate 70 (see FIG. 10) comprised of a bulk silicon substrate 70a, a buried insulation layer 70b, and a relatively thick active layer of silicon 70c in contact with the buried insulation layer 70b. Simply put, in one illustrative method, the starting material is an SOI substrate wherein the active layer of silicon 70c is relatively thick, e.g., approximately 20-30 microns.

The active layer of silicon 70c may be comprised of traditional silicon material formed by the Czochralski (CZ) method. The structure depicted in FIG. 10 may be formed by a variety of known techniques. The active layer of silicon 70c may be supplied in either a doped or undoped form. In some cases, at least one ion implant process may be performed to introduce the desired dopant materials, e.g., N-type dopant materials, into the relatively thick active layer 70c. The distribution of such dopant atoms within the active layer 70c may not be uniform throughout its thickness. After the active layer 70c is properly doped, the opto-isolator device 30 may then be formed on the structure depicted in FIG. 10 using the methodologies depicted and described in the specification.

The present invention is generally directed to various embodiments of an optical isolator device, and various methods of making and using same. In one illustrative embodiment, the method comprises obtaining a single SOI substrate, the SOI substrate having an active layer comprised of silicon and a buried insulation layer, forming a doped layer of silicon above the active layer of the SOI substrate, forming first and second isolated regions in at least the doped layer of silicon, forming a photon generating device in the first isolated region, and forming a photon receiving device in the second isolated region.

In another illustrative embodiment, the method comprises obtaining a single SOI substrate, the SOI substrate having an active layer comprised of silicon and a buried insulation layer, forming a doped layer of epitaxial silicon above the active layer of the SOI substrate, forming first and second isolated regions in at least the doped layer of epitaxial silicon, forming a photon generating device in the first isolated region, and forming a photon receiving device in the second isolated region.

In yet another illustrative embodiment, the method comprises obtaining a single SOI substrate, the SOI substrate having a doped active layer comprised of silicon formed on a buried insulation layer, forming first and second isolated regions in the doped active layer of silicon, forming a photon generating device in the first isolated region, and forming a photon receiving device in the second isolated region.

In one illustrative embodiment, the device comprises a substrate comprised of a bulk layer of silicon, a buried insulation layer formed on the bulk silicon layer, and a doped layer of silicon positioned above the buried insulating layer, first and second isolated regions formed in the doped layer of silicon, a photon generating device formed in the first isolated region, and a photon receiving device formed in the second isolated region.

In another illustrative embodiment, the device comprises a substrate comprised of a bulk layer of silicon, a buried insulation layer formed on the bulk silicon layer, and a doped layer of epitaxial silicon positioned above the buried insulating layer, first and second isolated regions formed in the doped layer of epitaxial silicon, a photon generating device formed in the first isolated region, and a photon receiving device formed in the second isolated region.

In yet another illustrative embodiment, the device comprises a substrate comprised of a bulk layer of silicon, a buried insulation layer formed on the bulk silicon layer, and a doped layer of silicon in contact with the buried insulating layer, first and second isolated regions formed in the doped layer of silicon, a photon generating device formed in the first isolated region, and a photon receiving device formed in the second isolated region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   obtaining a single SOI substrate, said SOI substrate having an active layer comprised of silicon and a buried insulation layer;
   forming a doped layer of silicon above said active layer of said SOI substrate;
   forming first and second isolated regions in at least said doped layer of silicon;
   forming a photon generating device in said first isolated region; and
   forming a vertical photon receiving device in said second isolated region.

2. The method of claim 1, wherein said doped layer of silicon is a doped layer of epitaxial silicon that is formed by a process comprised of introducing a dopant material during an epitaxial deposition process performed to form said doped layer of epitaxial silicon.

3. The method of claim 1, wherein said doped layer of silicon is a doped layer of epitaxial silicon that is formed by a process comprised of:
performing an epitaxial deposition process to form a layer of epitaxial silicon; and
performing at least one ion implant process to introduce a dopant material into said layer of epitaxial silicon formed by said epitaxial deposition process.

4. The method of claim 1, wherein forming said doped layer of silicon comprises forming said doped layer of silicon such that it has a thickness that ranges from approximately 10-30 microns.

5. The method of claim 1, wherein said doped layer of silicon is doped with an N-type dopant material.

6. The method of claim 1, wherein said doped layer of silicon has a dopant concentration that ranges from approximately $3 \times 10^{14}$-$10^{15}$ ions/cm$^3$.

7. The method of claim 1, wherein forming said first and second isolated regions in at least said doped layer of silicon comprises forming a plurality of trench isolation regions that extend through said doped layer of silicon and contact said buried insulation layer of said SOI substrate to thereby form said first and second isolated regions.

8. The method of claim 7, wherein said trench isolation regions are filled with at least one insulating material.

9. The method of claim 1, wherein said photon generating device is comprised of at least one of a forward biased diode, a reverse biased diode and a bipolar transistor.

10. The method of claim 1, wherein said vertical photon receiving device is comprised of at least one of a bipolar transistor, a forward biased diode, a reverse biased diode, an avalanche diode, an avalanche transistor and a field effect transistor.

11. The method of claim 1, wherein said photon generating device is a diode and said vertical photon receiving device is a bipolar transistor, and the method further comprises:
performing at least one ion implant process to form a P-doped region in said first isolated region for said diode and to form a P-doped base region in said second isolated region to form a base region for said bipolar transistor;
performing at least one ion implant process to form an N-doped emitter region within said P-doped base region of said bipolar transistor; and
forming at least one conductive contact to each of said P-doped region of said diode and said N-doped emitter region of said bipolar transistor.

12. The method of claim 1, wherein said photon generating device is a diode and said vertical photon receiving device is a bipolar transistor, and the method further comprises:
performing at least one ion implant process to form an N-doped region in said first isolated region for said diode and to form an N-doped base region in said second isolated region to form a base region for said bipolar transistor;
performing at least one ion implant process to form a P-doped emitter region within said N-doped base region of said bipolar transistor; and
forming at least one conductive contact to each of said N-doped region of said diode and said P-doped emitter region of said bipolar transistor.

13. The method of claim 1, wherein forming the photon generating device further comprises forming a vertical photon generating device.

14. The method of claim 13, wherein the first isolated region includes silicon doped with ions of a first conductivity type, and forming the vertical photon generating device comprises forming a first doped region doped with ions having a second conductivity type different than the first conductivity type in the first isolated region.

15. The method of claim 1, wherein the first isolated region includes silicon doped with ions of a first conductivity type, and forming the vertical photon receiving device comprises:
forming a first doped region doped with ions having a second conductivity type different than the first conductivity type in the first isolated region; and
forming a second doped region doped with ions having the first conductivity type in the first doped region.

16. A method, comprising:
obtaining a single SOI substrate, said SOI substrate having a doped active layer comprised of silicon formed on a buried insulation layer;
forming first and second isolated regions in said doped active layer of silicon;
forming a photon generating device in said first isolated region; and
forming a vertical photon receiving device in said second isolated region.

17. The method of claim 16, wherein said doped active layer of silicon is comprised of silicon that is formed by the Czochralski (CZ) method.

18. The method of claim 16, wherein said doped active layer of silicon is a doped layer formed by performing at least one ion implant process to introduce a dopant material into said active layer of silicon.

19. The method of claim 16, wherein forming said first and second isolated regions in at least said active doped layer of silicon comprises forming a plurality of trench isolation regions that extend through said active doped layer of silicon and contact said buried insulation layer of said SOI substrate to thereby form said first and second isolated regions.

20. The method of claim 16, wherein said photon generating device is comprised of at least one of a forward biased diode, a reverse biased diode and a bipolar transistor.

21. The method of claim 16, wherein said vertical photon receiving device is comprised of at least one of a bipolar transistor, a forward biased diode, a reverse biased diode, an avalanche diode, an avalanche transistor and a field effect transistor.

22. The method of claim 18, wherein said photon generating device is a diode and said vertical photon receiving device is a bipolar transistor, and the method further comprises:
performing at least one ion implant process to form a P-doped region in said first isolated region for said diode and to form a P-doped base region in said second isolated region to form a base region for said bipolar transistor;
performing at least one ion implant process to form an N-doped emitter region within said P-doped base region of said bipolar transistor; and
forming at least one conductive contact to each of said P-doped region of said diode and said N-doped emitter region of said bipolar transistor.

23. The method of claim 18, wherein said photon generating device is a diode and said vertical photon receiving device is a bipolar transistor, and the method further comprises:

performing at least one ion implant process to form an N-doped region in said first isolated region for said diode and to form an N-doped base region in said second isolated region to form a base region for said bipolar transistor;

performing at least one ion implant process to form a P-doped emitter region within said N-doped base region of said bipolar transistor; and forming at least one conductive contact to each of said N-doped region of said diode and said P-doped emitter region of said bipolar transistor.

24. The method of claim 16, wherein forming the photon generating device further comprises forming a vertical photon generating device.

25. The method of claim 24, wherein the first isolated region includes silicon doped with ions of a first conductivity type, and forming the vertical photon generating device comprises forming a first doped region doped with ions having a second conductivity type different than the first conductivity type in the first isolated region.

26. The method of claim 16, wherein the first isolated region includes silicon doped with ions of a first conductivity type, and forming the vertical photon receiving device comprises:

forming a first doped region doped with ions having a second conductivity type different than the first conductivity type in the first isolated region; and forming a second doped region doped with ions having the first conductivity type in the first doped region.

* * * * *